(12) United States Patent
Takano et al.

(10) Patent No.: US 8,012,783 B2
(45) Date of Patent: Sep. 6, 2011

(54) SEMICONDUCTOR ELEMENT AND METHOD FOR MANUFACTURING SAME

(75) Inventors: Tsuyoshi Takano, Amagasaki (JP);
Takahide Joichi, Amagasaki (JP);
Hiroaki Okagawa, Amagasaki (JP)

(73) Assignee: Mitsubishi Chemical Corporation, Tokyo (JP)

( * ) Notice: Subject to any disclaimer, the term of this patent is extended or adjusted under 35 U.S.C. 154(b) by 374 days.

(21) Appl. No.: 11/887,439

(22) PCT Filed: Apr. 4, 2006

(86) PCT No.: PCT/JP2006/307526
§ 371 (c)(1),
(2), (4) Date: Nov. 16, 2007

(87) PCT Pub. No.: WO2006/109760
PCT Pub. Date: Oct. 19, 2006

(65) Prior Publication Data
US 2009/0065938 A1 Mar. 12, 2009

(30) Foreign Application Priority Data

Apr. 8, 2005 (JP) ................................. 2005-112610
Feb. 8, 2006 (JP) ................................. 2006-031741

(51) Int. Cl.
| H01L 21/00 | (2006.01) |
| H01L 21/28 | (2006.01) |
| H01L 21/31 | (2006.01) |
| H01L 29/22 | (2006.01) |
| H01L 23/52 | (2006.01) |
| H01L 23/48 | (2006.01) |
| H01L 29/40 | (2006.01) |
| H01L 23/485 | (2006.01) |

(52) U.S. Cl. ............ 438/45; 438/22; 438/602; 438/604; 438/785; 257/99; 257/745; 257/744; 257/E23.019

(58) Field of Classification Search ................... 438/25, 438/45, 602, 604, 785; 257/99, 744, 745, 257/E23.019

See application file for complete search history.

(56) References Cited

U.S. PATENT DOCUMENTS 5,160,534 A    11/1992    Hiraki
(Continued)

FOREIGN PATENT DOCUMENTS

JP          5-295531          11/1993
(Continued)

OTHER PUBLICATIONS

Supplementary European Search Report dated Apr. 28, 2009 in European Patent Application 06 73 1473 corresponding to the present application.

(Continued)

Primary Examiner — Luan C Thai
(74) Attorney, Agent, or Firm — Wenderoth, Lind & Ponack, L.L.P.

(57) ABSTRACT

The object of the present invention is to provide a semiconductor element containing an n-type gallium nitride based compound semiconductor and a novel electrode that makes an ohmic contact with the semiconductor.

The semiconductor element of the present invention has an n-type Gallium nitride based compound semiconductor and an electrode that forms an ohmic contact with the semiconductor, wherein the electrode has a TiW alloy layer to be in contact with the semiconductor. According to a preferable embodiment, the above-mentioned electrode can also serve as a contact electrode. According to a preferable embodiment, the above-mentioned electrode is superior in the heat resistance. Moreover, a production method of the semiconductor element is also provided.

19 Claims, 5 Drawing Sheets

U.S. PATENT DOCUMENTS

| | | | |
|---|---|---|---|
| 5,470,527 | A | 11/1995 | Yamanobe et al. |
| 5,563,422 | A | 10/1996 | Nakamura et al. |
| 5,990,500 | A * | 11/1999 | Okazaki .......................... 257/99 |
| 6,172,382 | B1 * | 1/2001 | Nagahama et al. ............. 257/94 |
| 6,921,928 | B2 * | 7/2005 | Sonobe .......................... 257/99 |
| 7,083,679 | B2 * | 8/2006 | Kiyoku et al. ................ 117/101 |
| 2004/0026701 | A1 | 2/2004 | Murai et al. |
| 2004/0228042 | A1 * | 11/2004 | Oshima et al. ................ 360/322 |
| 2005/0173739 | A1 | 8/2005 | Kusumoto et al. |

FOREIGN PATENT DOCUMENTS

| | | |
|---|---|---|
| JP | 11-8410 | 1/1999 |
| JP | 2004-96061 | 3/2004 |
| JP | 2004-349595 | 12/2004 |
| JP | 2005-51137 | 2/2005 |

OTHER PUBLICATIONS

Chin-Yuan Hsu et al., "Effect of thermal annealing of Ni/Au ohmic contact on the leakage current of GaN based light emitting diodes", Applied Physics Letters, vol. 83, No. 12, pp. 2447-2449, XP012035181, ISSN: 0003-6951, Sep. 22, 2003.

V. Rajagopal Reddy et al., "Electrical and structural properties of Ti/W/Au ohmic contacts on n-type GaN", Institute of Physics Publishing, Semiconductor Science and Technology, vol. 19, No. 8, pp. 975-979, Aug. 2004.

C.K. Wang et al., "GaN MSM photodetectors with TiW transparent electrodes", Materials Science & Engineering B, Elsevier Sequoia, Switzerland, vol. 112, No. 1, pp. 25-29, XP004525758, ISSN: 0921-5107, Sep. 15, 2004.

James D. Plummer et al., "Silicon VLSI Technology, Fundamentals, Practice and Modeling", Prentice Hall, N.J., pp. 566-567 and 694-695, 2000.

International Search Report issued Jun. 27, 2006 in the International (PCT) Application of which the present application is the U.S. National Stage.

English translation of Chinese Office Action dated Aug. 29, 2008 issued in connection with Chinese Patent Application No. 200680011218.0 corresponding to the present application.

* cited by examiner (a)

(b)

SEMICONDUCTOR ELEMENT AND METHOD FOR MANUFACTURING SAME

TECHNICAL FIELD

The present invention relates to a semiconductor element comprising an n-type gallium nitride based compound semiconductor and an electrode that makes an ohmic contact with the semiconductor and a production method thereof.

BACKGROUND ART

Gallium nitride based compound semiconductor (hereinafter to be also referred to as "GaN-based semiconductor") is compound semiconductor made of a III group nitride represented by the chemical formula:

$Al_aIn_bGa_{1-a-b}N(0 \leq a \leq 1, 0 \leq b \leq 1, 0 \leq a+b \leq 1)$, which is exemplified by those having any composition such as GaN, InGaN, AlGaN; AlInGaN, AlN, InN and the like. A compound semiconductor of the above-mentioned chemical formula wherein a part of the III group element is substituted by B (boron), Tl (thallium) and the like and one wherein a part of N (nitrogen) is substituted by P (phosphorus), As (arsenic), Sb (antimony), Bi (bismuth) and the like are encompassed in the GaN-based semiconductor.

In recent years, GaN-based semiconductor light emitting elements such as light emitting diode (LED), laser diode (LD) and the like, which emit light having a wavelength of from green to ultraviolet, have been practiced and are drawing attention. This light emitting element has, as a basic structure, a pn junction diode structure formed by joining an n-type GaN-based semiconductor and a p-type GaN-based semiconductor. Simply put, according to the emission mechanism of the light emitting element, when electron injected into n-type GaN-based semiconductor and positive hole injected into p-type GaN-based semiconductor are recombined together to lose energy in the pn junction or the vicinity thereof, the light corresponding to the energy is emitted. In such an element, an electrode that makes an ohmic contact with an n-type GaN-based semiconductor (hereinafter to be also referred to as "n-type ohmic electrode") is used to efficiently inject electron into an n-type GaN-based semiconductor. In LED, a constitution wherein an n-type ohmic electrode also serves as a contact electrode is generally employed. A contact electrode is an electrode to which a bonding wire, a solder and the like used for electric connection of an element and an external electrode for the element are bonded. A contact electrode is required to show a good bondability with a bonding wire (e.g., Au wire) or a solder (e.g., Au—Sn eutectic). When the bondability is poor, a defect tends to occur in a chip mounting process.

Conventionally, a single layer film of Al (aluminum) or a multi-layer film wherein an Al layer is laminated on a Ti (titanium) layer has been used as an n-type ohmic electrode (JP-A-7-45867, U.S. Pat. No. 5,563,422). However, since these electrodes are mainly made of an Al layer, they show low heat resistance and, for example, problematically easily deformed when a heat treatment is applied. This is caused by the facts that Al has a low melting point, thermal stress is easily developed inside the electrode because the thermal expansion coefficient of Al is extremely large as compared to that of GaN-based semiconductor, and the like. Moreover, when these electrodes are used as contact electrodes, an oxidized film is formed on the surface of Al, which degrades Au wire bondability and wettability by Au—Sn eutectic solder. Therefore, the yield tends to be low in a chip mounting process. To solve this problem, an electrode wherein an Au layer is laminated on an Al layer at a layer made of a metal having a comparatively high melting point has been proposed (JP-A-7-221103, U.S. Pat. No. 5,563,422). However, this electrode also requires a heat treatment at a temperature of about 400° C. to decrease the contact resistance, since it is in contact with an n-type GaN-based semiconductor at an Al layer. The heat treatment roughens the surface of the electrode and problematically degrades the bondability of the electrode with bonding wire or solder. This electrode is associated with the problem in that production of electrodes with the same property with good reproducibility is difficult, since the contact resistance with n-type GaN-based semiconductor after a heat treatment is affected by the diffusion state of Al and Au due to the thermal stress.

As an n-type ohmic electrode free of Al, JP-A-11-8410 discloses an n-type ohmic electrode obtained by laminating TiW alloy layer, Ge (germanium) layer and Rh (rhodium) layer and heat-treating the laminate. The principle of the good ohmic contact formed by the electrode with the n-type GaN-based semiconductor is unclear. However; since a good ohmic contact is formed irrespective of the order of lamination of these three metal layers, it is postulated that a product resulting from the chemical reaction involving all three metal layers plays some role. Therefrom it is expected that the property of the obtained electrode will not be stabilized unless the conditions under which the three layers are laminated and the conditions of the subsequent heat treatment in the formation of the electrode are strictly controlled. Therefore, a semiconductor element using this electrode is considered to be unsuitable for a large-scale production.

DISCLOSURE OF THE INVENTION

The present invention has been made in view of such situation and aims at providing a semiconductor element comprising a novel n-type ohmic electrode that forms a good ohmic contact with an n-type GaN-based semiconductor. The present invention also aims at providing a semiconductor element comprising an n-type ohmic electrode that can be preferably used as a contact electrode. Moreover, the present invention aims at providing a semiconductor element comprising an n-type ohmic electrode superior in the heat resistance. Furthermore, the present invention aims at providing a production method of the above-mentioned semiconductor element.

The characteristics of the present invention are as follows.
(1) A semiconductor element comprising an n-type Gallium nitride based compound semiconductor, and an electrode in ohmic contact with the semiconductor, wherein the electrode has a TiW alloy layer in contact with the semiconductor.
(2) The semiconductor element of (1) above, wherein said TiW alloy layer has a Ti concentration of 70 wt % or below.
(3) The semiconductor element of (2) above, wherein said TiW alloy layer has a Ti concentration of 40 wt % or below.
(4) The semiconductor element of (3) above, wherein said TiW alloy layer has a Ti concentration of 8 wt % or below.
(5) The semiconductor element of any one of (1)-(4) above, wherein said TiW alloy layer has a Ti concentration of 4 wt % or above.
(6) The semiconductor element of (1) above, wherein the W—Ti composition ratio of the TiW alloy layer is substantially constant in the thickness direction of the layer.
(7) The semiconductor element of (1) above, wherein the TiW alloy layer is formed by sputtering using a Ti—W target with a Ti content of 90 wt % or below.

(8) The semiconductor element of (7) above, wherein the TiW alloy layer is formed by sputtering using a Ti—W target with a Ti content of 10 wt %.
(9) The semiconductor element of (4) or (8) above, wherein the electrode is heat-treated.
(10) The semiconductor element of any one of (1)-(9) above, wherein the electrode has a metal layer laminated on the TiW alloy layer.
(11) The semiconductor element of (10) above, wherein the metal layer comprises an Au layer.
(12) The semiconductor element of (11) above, wherein said layer comprises an Au layer laminated directly on the aforementioned TiW alloy layer.
(13) The semiconductor element of (11) above, wherein the metal layer is made of a single layer of Au, or a laminate having an Au layer as the top layer.
(14) The semiconductor element of (11) above, wherein the metal layer comprises only a metal having the same melting point as Au or a melting point higher than Au.
(15) The semiconductor element of (10) above, wherein the metal layer is free of Rh.
(16) The semiconductor element of any one of (1)-(15) above, wherein the surface of the electrode has an arithmetic mean roughness Ra of 0.02 μm or below.
(17) A method of producing a semiconductor element, which comprises a step of forming a TiW alloy layer as a part of an electrode on the surface of an n-type Gallium nitride based compound semiconductor.
(18) The production method of (17) above, wherein the TiW alloy layer is formed by sputtering using a Ti—W target.
(19) The production method of (18) above, wherein the TiW alloy layer has a Ti concentration of 70 wt % or below.
(20) The production method of (18) above, which further comprises a step of heat-treating the TiW alloy layer.

In the present invention, the TiW alloy substantially consists only of Ti and W (tungsten). According to the present invention, a semiconductor element comprising an n-type ohmic electrode that forms a good ohmic contact with an n-type GaN-based semiconductor can be obtained. According to a preferable embodiment of the present invention, a semiconductor element comprising an n-type ohmic electrode that can be preferably used as a contact electrode can be obtained. According to a preferable embodiment of the present invention, a semiconductor element comprising an n-type ohmic electrode superior in the heat resistance can be obtained.

BRIEF DESCRIPTION OF THE DRAWINGS

FIG. 1(a) is a top view,
and FIG. 1(b) is a sectional view along the line X-Y in FIG. 1(a).

Figure 1:
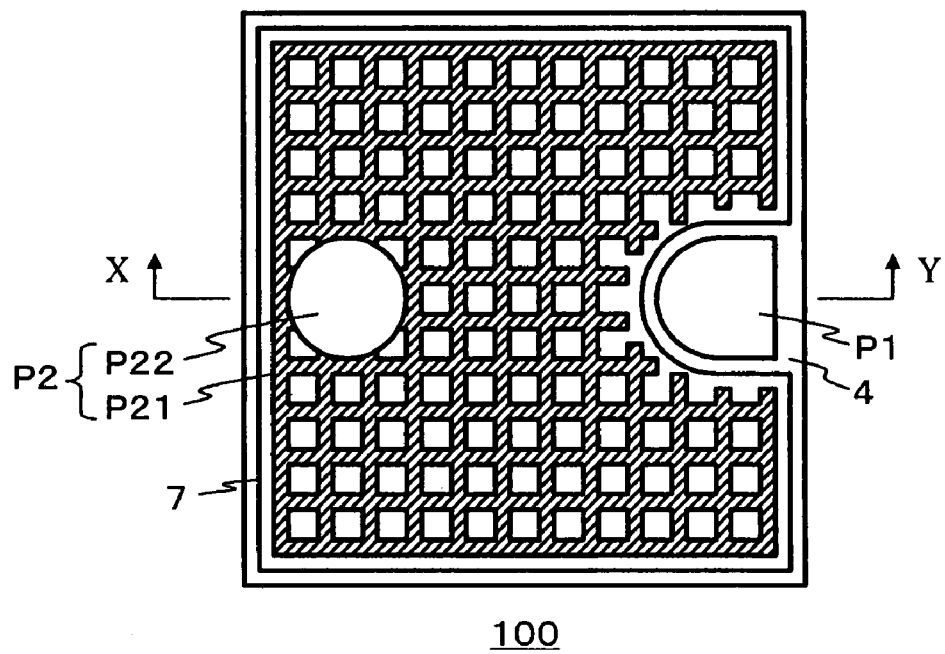
FIG. 1 is a schematic diagram of a structure of a Gallium nitride based compound semiconductor element of the embodiment of the present invention.
Figure 1:
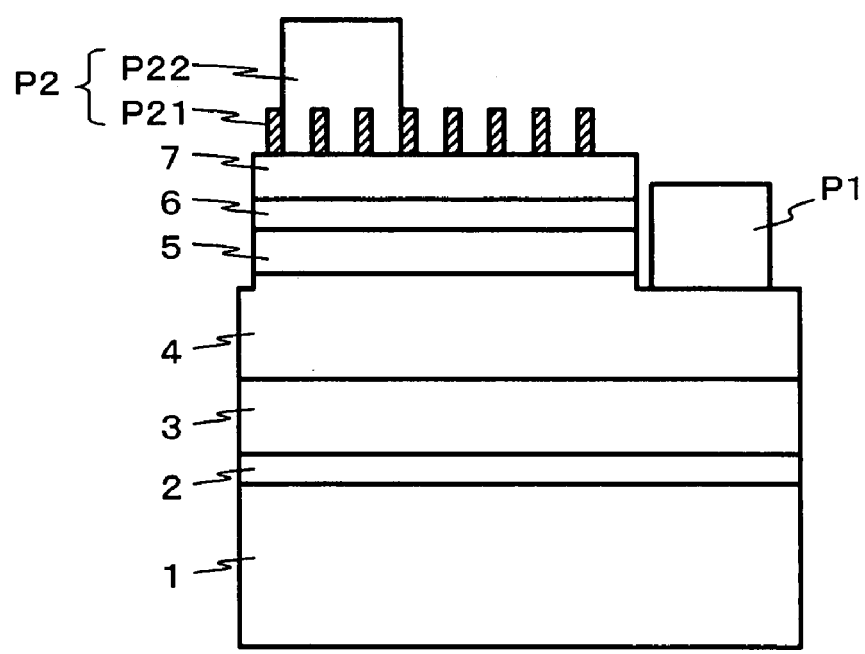

The symbols in FIG. 1 mean the following. 1 substrate, 2 first buffer layer, 3 second buffer layer, 4 n-type contact layer, 5 active layer, 6 p-type clad layer, 7 p-type contact layer, P1 n-side electrode, P2 p-side electrode, P21 p-side ohmic electrode, P22 p-side bonding electrode, 100 semiconductor element

BEST MODE FOR EMBODYING THE INVENTION

The present invention can be applied to any element comprising an n-type GaN-based semiconductor, and an electrode that forms an ohmic contact with the semiconductor, i.e., n-type ohmic electrode. The semiconductor element of the present invention may comprise a part made of a semiconductor other than the GaN-based semiconductor. The semiconductor element of the present invention is typically a light emitting element. Alternatively, it may be, for example, a light receiving element or an electronic element such as transistor and the like.

In the semiconductor element of the present invention, the n-type GaN-based semiconductor on which an n-type ohmic electrode is formed may have any composition. The n-type GaN-based semiconductor may be undoped or doped with impurity, as long as it shows the n-type conductivity. Preferably, the n-type GaN-based semiconductor to be in contact with TiW alloy layer is $Al_xGa_{1-x}N$ ($0 \leq x \leq 0.2$). In addition, the n-type GaN-based semiconductor to be in contact with the TiW alloy layer preferably has a carrier concentration of $1 \times 10^{18}/cm^3$-$1 \times 10^{20}/cm^3$, more preferably $5 \times 10^{18}/cm^3$-$5 \times 10^{19}/cm^3$. Particularly, an n-type GaN-based semiconductor having a carrier concentration controlled to the above-mentioned preferable concentration range by doping with n-type impurity is preferable. The kind of the n-type impurity is not limited and any known n-type impurity, such as Si, Ge and the like, applicable to a GaN-based semiconductor can be used. In the semiconductor element of the present invention, the n-type GaN-based semiconductor, on which an n-type ohmic electrode is formed, may be formed by a vapor phase method such as MOVPE (Metal Organic Vapor Phase Epitaxy), HVPE (Hydride Vapor Phase Epitaxy), MBE (Molecular Beam Epitaxy) and the like, or formed by a high-pressure method, a liquid phase method and the like. The n-type GaN-based semiconductor may be grown as a thin film on a substrate, or may be a substrate.

In the semiconductor element of the present invention, the n-type ohmic electrode may also serve as a contact electrode. Alternatively, the semiconductor element may have one or plural contact electrodes electrically connected to the n-type ohmic electrode, in addition to the n-type ohmic electrode. When the n-type ohmic electrode also serves as a contact electrode, an electrode having higher flatness of the surface shows better bonding state of the electrode and a bonding wire or solder, which improves the yield in a bonding process using an automatic machine. Specifically, an arithmetical mean roughness Ra of the surface of the n-type ohmic electrode that also serves as a contact electrode is preferably 0.02 μm or below.

For the semiconductor element of the present invention, the method of forming the TiW alloy layer contained in the n-type ohmic electrode is not limited, and a conventionally known method of forming a TiW alloy thin film can be appropriately used. Preferably, the TiW alloy layer can be formed by sputtering using a Ti—W target. The detail of the Ti—W target can be known from JP-A-5-295531 (U.S. Pat. No. 5,470,527), JP-A-4-193947, JP-A-4-293770 (U.S. Pat. No. 5,160,534) and other known literatures. A TiW alloy layer formed using a Ti—W target may contain, besides Ti and W, impurity inevitably contained in the target. It is acceptable that the TiW alloy layer contains such impurity difficult to be removed from the starting material. In the semiconductor element of the present invention, film thickness of the TiW alloy layer contained in the n-type ohmic electrode is, for example, 0.01 µm-1 µm, preferably 0.05 µm-0.5 µm. The Ti concentration of the TiW alloy layer is not particularly limited. However, when the content of the Ti component in the Ti—W target is less than 5 wt % in the case of formation by sputtering, the adhesion between the TiW alloy thin film to be formed and the substrate becomes poor and the film is said to be easily separated therefrom (U.S. Pat. No. 5,470,527). When the Ti—W target has a Ti content of less than 5 wt %, the TiW alloy layer to be formed has a Ti concentration of less than 4 wt %, and therefore, the TiW alloy layer preferably has a Ti concentration of not less than 4 wt %. As shown in the Experimental Examples below, the heat resistance of the n-type ohmic electrode becomes good when the TiW alloy layer in the electrode has a lower Ti concentration. Therefore, the Ti concentration of the TiW alloy layer is preferably 40 wt % or below, more preferably 20 wt % or below, more preferably 8 wt % or below.

In the TiW alloy layer, the composition ratio of W and Ti is preferably substantially constant in the thickness direction of the layer. When the composition ratio of W and Ti is constant, diffusion of W atom or Ti atom does not occur because density gradient is absent. Hence, when a semiconductor element is placed in a high temperature environment, the property variation of the n-type ohmic electrode is suppressed.

In the semiconductor element of the present invention, the n-type ohmic electrode may be a laminate made of a TiW alloy layer in contact with an n-type GaN-based semiconductor, and a metal layer laminated thereon. The metal layer can be formed from any metal material (can be a single metal or alloy). In addition, the metal layer may be a single layer or have a laminate structure. To decrease the resistance of the electrode, the metal layer is preferably formed with a metal having high conductivity, such as Ag, Cu, Au, Al and the like. To reduce the thermal stress applied to the TiW alloy layer when an n-type ohmic electrode is formed in such a laminate, the metal layer is preferably formed as an Au layer or a laminate of an Au layer and other metal layer. This is because Au is a soft and easily deformable metal. By reducing the thermal stress applied to the TiW alloy layer, occurrence of problems such as deformation and separation of n-type ohmic electrode, contact instability between n-type ohmic electrode and n-type GaN-based semiconductor and the like can be prevented. This effect is considered to be particularly remarkable when the Au layer is laminated directly on the TiW alloy layer. When the n-type ohmic electrode is the above-mentioned laminate, the layer exposed on the surface of the laminate, i.e., the top layer of the metal layer laminated on the TiW alloy layer, is formed with a chemically stable metal such as Au, platinum group element and the like, whereby the resistance to corrosion of the n-type ohmic electrode is improved. When the n-type ohmic electrode also serves as a contact electrode, the top layer is preferably an Au layer. When the n-type ohmic electrode is the above-mentioned laminate and the metal layer to be laminated on the TiW alloy layer contains an Al layer, the electrode shows degraded heat resistance. From the aspect of heat resistance, therefore, it is preferable that the metal layer does not contain Al. When a metal layer containing an Au layer is laminated on the TiW alloy layer, in consideration of the heat resistance, it is preferable to form the metal layer only with a metal having the same melting point as Au or a melting point higher than Au.

The ohmic contact between the n-type ohmic electrode and the n-type GaN-based semiconductor in the semiconductor element of the present invention is not formed by the action of the product from a chemical reaction involving Rh, unlike the electrode disclosed in JP-A-11-8410. Accordingly, when the n-type ohmic electrode in the semiconductor element of the present invention is the above-mentioned laminate, the metal layer to be laminated on the TiW alloy layer may be free of Rh.

In the semiconductor element of the present invention, heat treatment of n-type ohmic electrode can be omitted. This is because the n-type ohmic electrode to be in contact with the n-type GaN-based semiconductor at a TiW alloy layer shows low contact resistance of the level causing no practical problem, even without a heat treatment. When the heat treatment of the n-type ohmic electrode can be omitted, advantages are provided in that the time necessary for the production can be shortened and also the degree of freedom of the production process design of the semiconductor element can be increased. In addition, when the heat treatment is omitted, the problem of roughening of the surface of the electrode due to the heat treatment is resolved by itself. Therefore, the n-type ohmic electrode is suitable for an electrode which also serves as a contact electrode.

On the other hand, in the semiconductor element of the present invention, the heat treatment of the n-type ohmic electrode can be performed optionally. The temperature and time of the heat treatment can be appropriately set depending on the heat resistance of the electrode, as long as the desired property is not impaired. As the atmospheric gas for the heat treatment, an inert gas such as nitrogen gas, rare gas and the like is preferably used. When the n-type ohmic electrode is the above-mentioned laminate, a heat treatment may be applied after completion of the formation of the laminate. Alternatively, for example, a heat treatment may be applied when a TiW alloy layer is formed, and thereafter a metal layer may be laminated on the TiW alloy layer. When a heat treatment is applied to the n-type ohmic electrode, diffusion of the component of the n-type GaN-based semiconductor into the TiW alloy layer or diffusion of the component of the TiW alloy into the n-type GaN-based semiconductor may occur. However, as long as the effect of the invention is not impaired, such diffusion is acceptable.

EXAMPLES

The present invention is explained in detail in the following by referring to Examples, which are not to be construed as limitative.

Experimental Example 1 (Example 1, Comparative Example 1)

The GaN-based semiconductor element having the structure shown in FIG. 1 was prepared and subjected to the evaluation. The GaN-based semiconductor element 100 shown in FIG. 1 is a light emitting diode having a structure wherein a first buffer layer 2, a second buffer layer 3, an n-type contact layer 4, an active layer 5, a p-type clad layer 6 and a p-type contact layer 7 are laminated in this order on a substrate 1. On the n-type contact layer 4, an n-side electrode P1 making an ohmic contact with the n-type contact layer 4 is formed. On the p-type contact layer 7, a p-side electrode P2 making an ohmic contact with the p-type contact layer 7 is formed. The p-side electrode P2 consists of a p-side ohmic electrode P21 formed over the entire surface of the p-type contact layer 7, and a p-side bonding electrode P22 electrically connected to the p-side ohmic electrode P21. The GaN-based semiconductor element 100 was prepared as follows.

(Crystal Growth)

A sapphire substrate 1 (diameter 2 inch) was set in an MOVPE growth furnace, the substrate temperature was raised to 1100° C. while flowing a hydrogen gas, whereby the surface of the substrate 1 was cleaned. Then, the substrate temperature was decreased to 500° C., and a first buffer layer 2 made of GaN was grown in a film thickness of about 30 nm on the substrate 1 using hydrogen gas as a carrier gas and ammonia and TMG (trimethylgallium) as a starting material gas. Then, the supply of TMG was stopped, and the substrate temperature was raised to 1000° C. Using TMG and ammonia as the starting material gas, a second buffer layer 3 made of undoped GaN was grown in a film thickness of 2 μm. Then, silane gas was further supplied to grow n-type contact layer 4 in a film thickness of 3 μm, which was made of GaN doped with Si (silicon) to achieve a concentration of about $5 \times 10^{18}/cm^3$. Then, the supply of TMG and silane gas was stopped, the substrate temperature was decreased to 800° C. and, using TMG, TMI (trimethylindium), silane gas and ammonia, a barrier layer made of $In_xGa_{1-x}N$ and a well layer made of $In_yGa_{1-y}N$ (y>x) were alternately grown to form an active layer 5 of a multiple quantum well structure with barrier layers at both ends. The film thickness of the barrier layer was set to 10 nm, and the film thickness of the well layer was set to 2 nm. In addition, the In composition y of the well layer was adjusted to achieve an emission wavelength of 400 nm. Then, the supply of TMG, TMI and silane gas was stopped, the substrate temperature was raised to 1000° C. again and, using TMG, TMA (trimethylaluminum), ammonia, and $(EtCp)_2Mg$ (bisethylcyclopentadienylmagnesium), p-type clad layer 6 made of $Al_{0.1}Ga_{0.9}N$ doped with Mg (magnesium) at a concentration of about $5 \times 10^{19}/cm^3$ was grown in a film thickness of 30 nm. Then, the supply of TMA was stopped, and p-type contact layer 7 made of GaN doped with Mg at a concentration of about $8 \times 10^{19}/cm^3$ was grown in a film thickness of 120 nm. After the completion of the growth of p-type contact layer 7, the substrate heating was stopped, the supply of starting material other than ammonia was stopped, and the substrate temperature was lowered to room temperature. Thereafter, to activate Mg in Mg-doped p-type clad layer 6 and Mg-doped p-type contact layer 7, a heat treatment at 900° C. was performed for 1 min in an RTA apparatus (rapid thermal annealing apparatus) in a nitrogen atmosphere.

(Formation of P-Side Ohmic Electrode)

Next, p-side ohmic electrode P21 was formed, wherein a Pd layer (film thickness 30 nm), an Au layer (film thickness 100 nm) and an Ni layer (film thickness 10 nm) were laminated in this order on the surface of the p-type contact layer 7, the top layer of the wafer, by electron-beam evaporation. As shown in FIG. 1(a), the p-side ohmic electrode P21 had an orthogonal lattice mesh pattern when seen from the top. In other words, it was an opening electrode where square shaped openings penetrating an electrode film were regularly disposed in large number through the length and the width of the film and the surface of the p-type contact layer 7 was exposed through the opening. The size of the opening was 8 μm for one side of the square, and the distance between neighboring openings (width of electrode part) was 2 μm for both the length and the width. The p-side ohmic electrode P21 was patterned by conventional lift-off method. That is, a resist mask patterned in a predetermined shape by photolithography was formed on the surface of the p-type contact layer 7, on which an electrode film having the above-mentioned laminate structure was formed, and the resist mask was lift-off, whereby the electrode film deposited on the resist mask was removed. Using RTA apparatus, the p-side ohmic electrode P21 was heat-treated. Thereafter, the conditions of the heat treatment were nitrogen atmosphere, 500° C. and 1 min.

(Formation of N-Side Electrode)

Next, a resist mask having a given shape was formed on the p-type contact layer 7 on which the p-side ohmic electrode P21 was formed. By RIE (reactive ion etching) using chlorine gas, the layer was etched from the p-type contact layer 7 side to expose the surface of the n-type contact layer 4 as shown in FIG. 1. After exposure, a TiW alloy layer (film thickness 100 nm), an Au layer (film thickness 100 nm), a Pt layer (film thickness 80 nm), an Au layer (film thickness 80 nm), a Pt layer (film thickness 80 nm), an Au layer (film thickness 80 nm), a Pt layer (film thickness 80 nm) and an Au layer (film thickness 80 nm) were laminated in this order on the surface of the n-type contact layer 4 by RF sputtering, whereby the n-side electrode P1 was formed. For formation of TiW alloy layer by RF sputtering, Ti—W target (manufactured by Mitsubishi Materials Corporation, product name: 4N W-10 wt % Ti target) was used as the target, Ar (argon) was used as the sputtering gas, and the conditions of RF power: 200 W, sputtering gas pressure: $1.0 \times 10^{-1}$ Pa were employed. The Ti—W target had a Ti content of 10.16 wt % (analysis value by absorption photometry) and an Fe (iron) content as impurity of 15 ppm (analysis value by ICP). The n-side electrode P1 was patterned by lift-off method as in the patterning of p-side ohmic electrode P21.

(Formation of P-Side Bonding Electrode)

Next, a p-side bonding electrode P22, wherein Ti with a film thickness of 20 nm and Au with a film thickness of 600 nm were laminated in this order, was formed on the p-side ohmic electrode P21 by electron-beam evaporation. Then, using plasma CVD, a passivation film (not shown, film thickness 300 nm) made of $SiO_2$ was formed to cover the wafer surface except the n-side electrode P1 and the p-side bonding electrode P22. Thereafter, using RTA apparatus, the n-side electrode P1 and the p-side bonding electrode P22 were heat-treated. The conditions of the heat treatment were nitrogen atmosphere, 500° C. and 1 min. In this way, a 350 μm square light emitting diode element (Example 1) was formed on a wafer.

(Evaluation)

Figure 2:
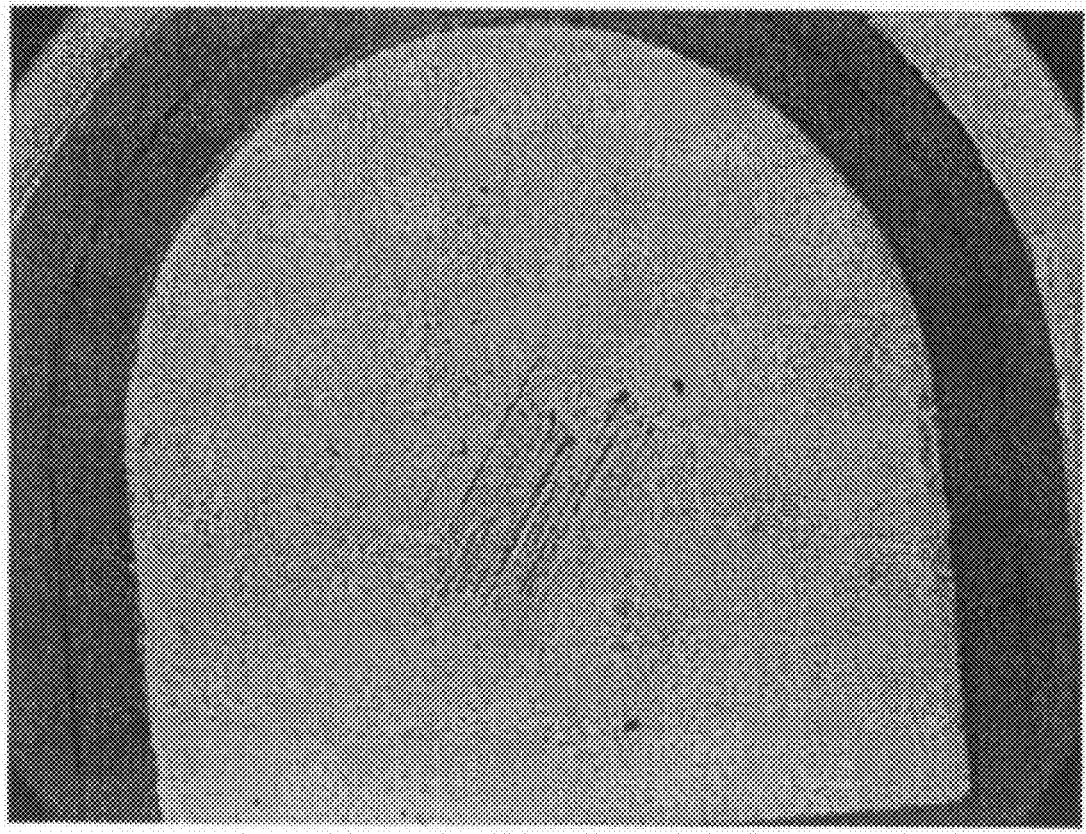
FIG. 2 shows an observation image of a surface of the electrode by a differential interference microscope.
Figure 3:
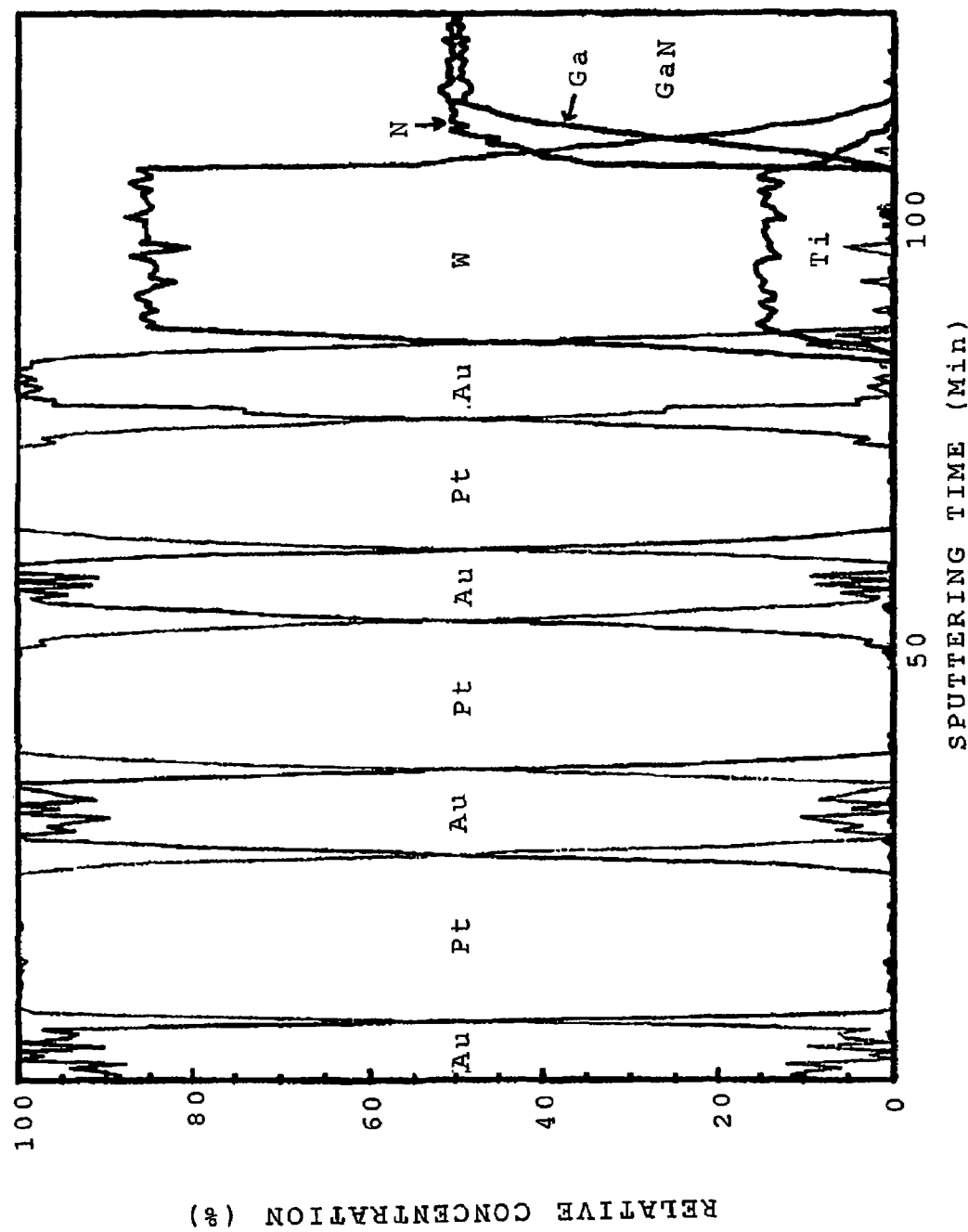
FIG. 3 shows composition analysis results in the electrode depth direction by an Auger electron spectroscopy.

The light emitting diode element prepared by the above-mentioned steps was evaluated as formed on the wafer without element separation (dicing into chips). FIG. 2 shows an observation image of the surface of the n-side electrode P1 with a differential interference microscope. As shown in FIG. 2, the surface of the n-side electrode P1 is flat and free of roughening. While plural diagonal lines are observed in the center of the electrode, they were scratches produced in the electric property evaluation process upon contact with the probe of an auto prober, and do not show surface roughening. The Vf (forward voltage) upon making a forward current of 20 mA flow in the element was measured with an auto prober and found to be 3.4 V. This value is a normal value as a Vf of a light emitting diode having an emission wavelength of 400 nm. Therefrom it is understood that the contact resistance of the n-side electrode P1 and the n-type contact layer 4 is sufficiently low to avoid practical problems. This also means that a good ohmic contact has been made between the n-side electrode P1 and the n-type contact layer 4. Shown in FIG. 3 are the results of the composition analysis in the depth direction of the n-side electrode P1, which were obtained using an Auger electron spectroscopy (AES). From FIG. 3, it is understood that the n-side electrode P1 is in contact with the n-type contact layer 4 at the TiW alloy layer. In addition, it is also understood that the composition ratio of Ti and W in the TiW alloy layer is substantially constant in the thickness direction.

For comparison, a light emitting diode element (Comparative Example 1) having the same constitution as the aforementioned element (Example 1) except that the n-side electrode was an Al layer (film thickness 600 nm) formed by electron-beam evaporation was prepared by the same method as for the aforementioned element. As a result of the evaluation of the element of Comparative Example 1, while the Vf measured with an auto prober was of the same level as for the element of Example 1, the surface of the n-side electrode was remarkably roughened.

Experimental Example 2 (Example 2, Comparative Example 2)

An experiment wafer wherein an Si-doped GaN layer was grown on a sapphire substrate (diameter 2 inch) at a low temperature GaN buffer layer was prepared by MOVPE. The following two kinds of electrodes of electrode A and electrode B were formed thereon and subjected to the evaluation.
electrode A: formed by laminating a TiW alloy layer (film thickness 100 nm) and an Au layer (film thickness 100 nm) in this order and applying a heat treatment at 500° C. for 1 min (Example 2).
electrode B: formed by laminating an Al layer (film thickness 100 nm), a TiW alloy layer (film thickness 100 nm) and an Au layer (film thickness 100 nm) in this order and applying a heat treatment at 400° C. for 1 min (Comparative Example 2). Respective metal layers contained in electrode A and electrode B were formed by RF sputtering. The film forming conditions for the TiW alloy layer contained in electrode A and electrode B were the same as those for the TiW alloy layer used in Experimental Example 1. The electrode was patterned by photolithography and lift-off. For photolithography, photomask used for patterning of the n-side electrode P1 in Experimental Example 1 was used.

Figure 4:
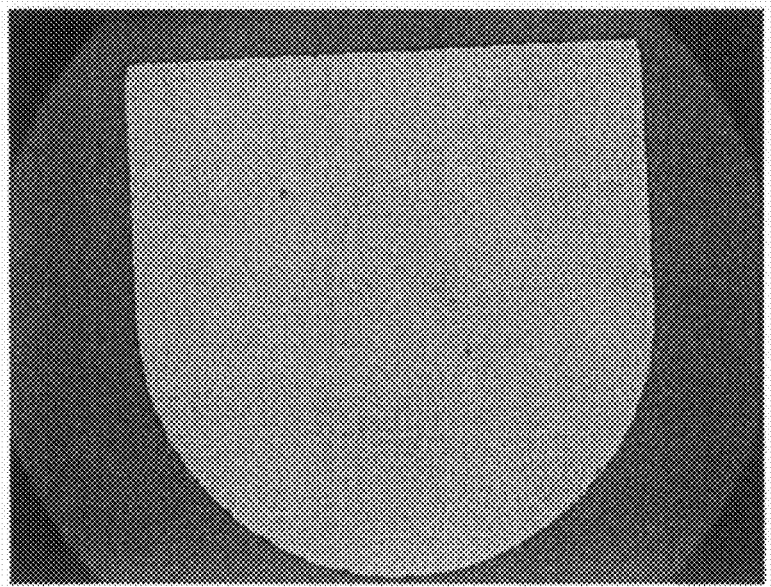
FIG. 4 shows an observation image of a surface of the electrode by a differential interference microscope.
Figure 5:
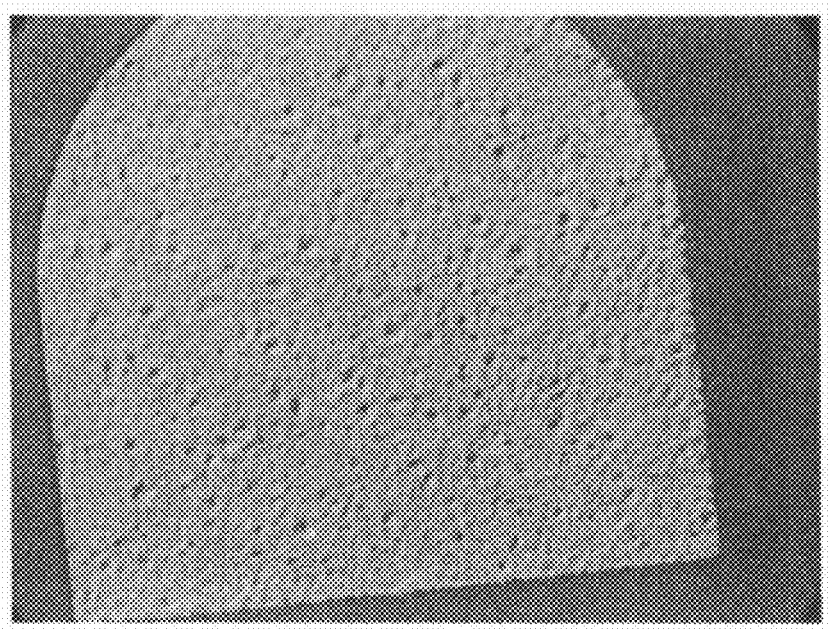
FIG. 5 shows an observation image of a surface of the electrode by a differential interference microscope.

FIG. 4 shows an observation image of the surface of electrode A by a differential interference microscope. In addition, FIG. 5 shows an observation image of the surface of electrode B by a differential interference microscope. As shown in FIG. 4, the surface of the electrode A, which was made by forming a TiW alloy layer on an Si-doped GaN layer first, and then laminating an Au layer thereon is flat and free of roughening, though the heat treatment temperature was 500° C. The arithmetic mean roughness Ra of the surface of electrode A was measured and found to be 0.014 μm. Since Ra of the Si-doped GaN layer surface being a base surface for electrode formation was 0.004 μm, Ra of the surface of the electrode A is not more than 4-fold of that of Ra of the base surface. In contrast, as shown in FIG. 5, the surface of the electrode B, which was made by forming an Al layer and then laminating a TiW layer and an Au layer thereon is markedly rough, though the heat treatment temperature was 400° C. The arithmetic mean roughness Ra of the surface of electrode B was measured and found to be 0.07 μm. This is about 18-fold of that of the surface of Si-doped GaN layer being the base surface.

Figure 6:
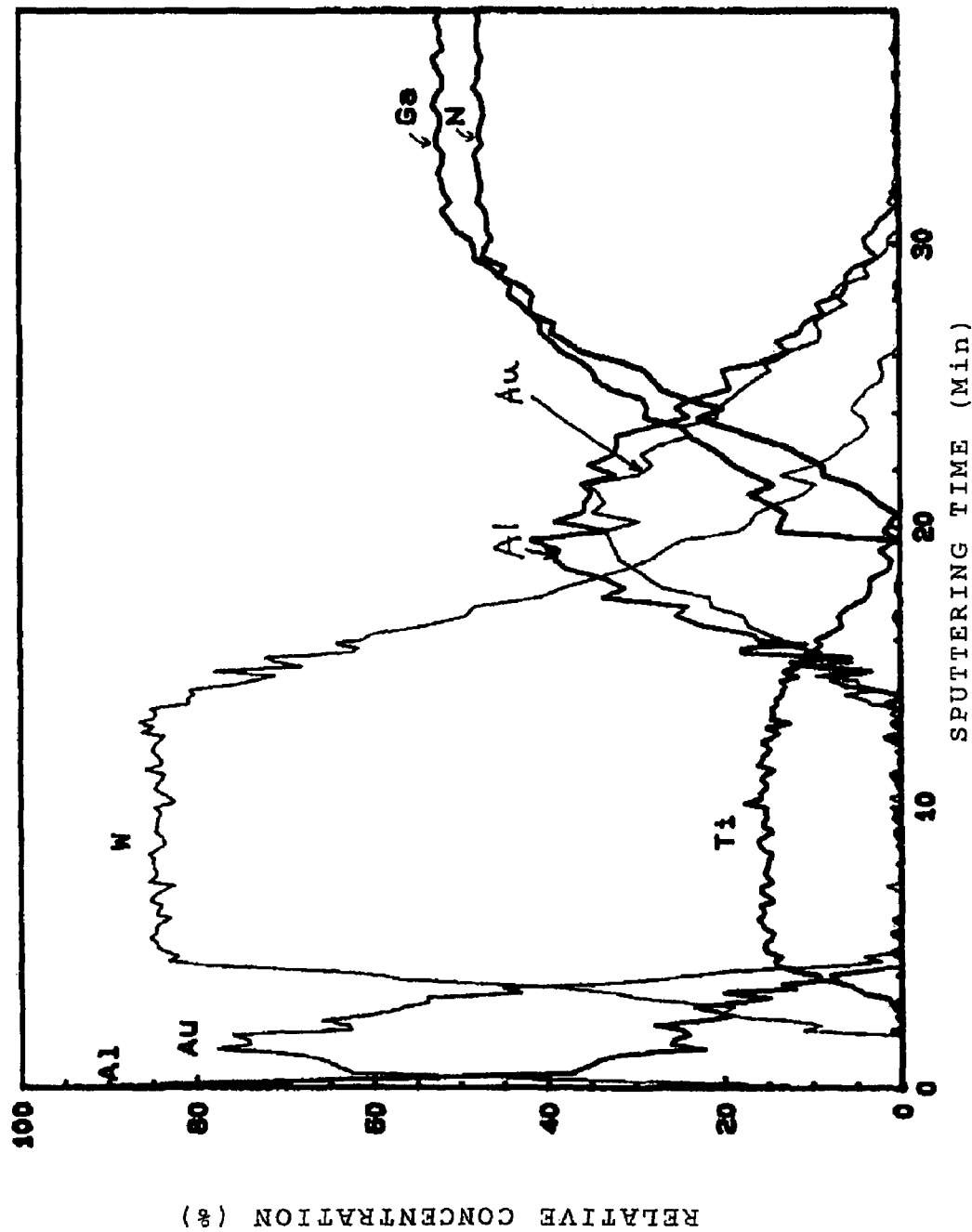
FIG. 6 shows composition analysis results in the electrode depth direction by an Auger electron spectroscopy.

FIG. 6 shows the results of the composition analysis in the depth direction of electrode B, which were obtained using an Auger electron spectroscopy. As shown in FIG. 6, in electrode B, Au in the Au layer formed on the TiW alloy layer diffuses to the Al layer side beyond the TiW alloy layer, and both Al and Au are present in the part close to the Si-doped GaN layer. Al also diffuses to the Au layer side beyond the TiW alloy layer. From Experimental Example 2, it is understood that electrode A having a TiW alloy layer in contact with the Si-doped GaN layer shows good heat resistance, but electrode B having a TiW alloy layer which is not in contact with the Si-doped GaN layer shows low heat resistance. One of the causes of the low heat resistance of the electrode B is considered to be the presence of Al layer in the electrode B, which Al layer has a low melting point and extremely different coefficient of thermal expansion from GaN.

It is known that the concentration of Ti contained in a TiW alloy thin film formed by sputtering using a Ti—W target tends to be lower than Ti content of the target, which is 80% or below of the Ti content of the target (JP-A-5-295531, U.S. Pat. No. 5,470,527). In the above-mentioned Experimental Example 1 and Experimental Example 2, since a Ti—W target containing Ti at 10 wt % was used, it is considered that the Ti concentration in the TiW alloy layer contained in the n-type ohmic electrode of the samples prepared in these Experimental Examples was 8 wt % or below.

Experimental Example 3 (Examples 3 and 4, Comparative Examples 3 and 4)

Samples for evaluation were prepared as follows. In the same manner as in Experimental Example 1, GaN-based semiconductor layers from a first buffer layer to a p-type contact layer were grown on a sapphire substrate to give a wafer with a GaN-based semiconductor laminate having a light emitting diode structure. Next, omitting the formation of a p-side ohmic electrode, an n-side electrode was formed. The n-side electrode was formed on the surface of the n-type contact layer (Si-doped n-type GaN with an Si concentration of about $5 \times 10^{18}/cm^3$) exposed by RIE, in the same manner as in Experimental Example 1. The n-side electrodes were the following 4 kinds (sample A-sample D).
sample A: the n-side electrode consisting of TiW alloy layer (film thickness 100 nm) and Au layer (film thickness 100 nm) laminated thereon (Example 3).
sample B: the n-side electrode consisting of W layer (film thickness 100 nm) and Au layer (film thickness 100 nm) laminated thereon (Comparative Example 3).
sample C: the n-side electrode consisting of Ti layer (film thickness 100 nm) and Au layer (film thickness 100 nm) laminated thereon (Comparative Example 4).
sample D: the n-side electrode consisting of TiW alloy layer (film thickness 100 nm), and Au layer (film thickness 100 nm), Pt layer (film thickness 80 nm), Au layer (film thickness 80 nm), Pt layer (film thickness 80 nm), Au layer (film thickness 80 nm), Pt layer (film thickness 80 nm) and Au layer (film thickness 80 nm) laminated thereon in this order (Example 4).

The respective metal layers contained in the n-side electrode of respective samples were formed by RF sputtering. The film forming conditions for the TiW alloy layer contained in sample A and sample D were the same as those for the TiW alloy layer used in Experimental Example 1. However, the TiW alloy layer of sample A was formed using a Ti—W target containing Ti by 10 wt %, as in Experimental Example 1, whereas the TiW alloy layer of sample D was formed using a Ti—W target containing Ti by 90 wt %. The Ti concentration of the TiW alloy layer in sample D is considered to be about 70 wt % or below. The n-side electrode was patterned in the same manner as in Experimental Example 1 for any sample. A wafer that reached the formation of the n-side electrode in this way was used as a sample for evaluation.
(Evaluation Before Heat Treatment)

The contact resistance of the n-side electrode of each sample was evaluated based on the voltage necessary for making a 20 mA current flow between the n-side electrodes of two adjacent elements on the wafer (hereinafter to be also referred to as "n-n voltage"). Since the voltage drop accompanied by the current flow inside the n-type contact layer is negligibly small, the n-n voltage reflects the contact resistance between n-side electrode and n-type contact layer. In other words, a sample with a higher n-n voltage has a higher contact resistance between n-side electrode and n-type contact layer. The n-n voltage of each sample with an n-side electrode as formed by sputtering was measured with an auto prober. The results are as follows.

sample A: 0.3V.
sample B: 0.7V.
sample C: 0.2V.
sample D: 0.3V.

The n-n voltage of 0.3 V of sample A and sample D is substantially equivalent to the separately measured n-n voltage 0.2 V of the sample of Example 1, which is practically sufficiently low. Therefrom it is understood that an electrode to be in contact with an n-type GaN-based semiconductor at a TiW alloy layer can be used as an ohmic electrode having a low contact resistance as formed. The surface of the electrodes of sample A and sample D was observed with a differential interference microscope and found to be extremely smooth.

While the electrode of sample A is in contact with an n-type contact layer at a TiW alloy layer containing Ti at a relatively low concentration (considered to be not more than 8% as mentioned above), it is noteworthy that the n-n voltage of sample A is not more than half the n-n voltage of sample B with an electrode to be in contact with an n-type contact layer at a W layer. This suggests that the property of TiW alloy layer in the electrode of sample A is not simple average of the properties of Ti and W. It is also understood that the contact resistance of the electrode to be in contact with n-type GaN-based semiconductor at TiW alloy layer hardly depends on the Ti concentration of the TiW alloy layer without a heat treatment since the n-n voltages of sample A and sample D are equivalent. This suggests that this electrode has stable property and is easy to produce.

(Evaluation after Heat Treatment)

Next, respective samples were subjected to a heat treatment in a nitrogen gas atmosphere at 500° C. for 1 min. The n-n voltage of respective samples after the heat treatment was as follows.

sample A: 0.2V.
sample B: 0.7V.
sample C: 2.4V.
sample D: 3.2V.

The surface of the electrode after the heat treatment was observed. As a result, the surface of the electrodes of sample A and sample B was in a good condition, namely, flat and free of roughening, whereas the surface of the electrodes of sample C and sample D was rough.

It is understood that an electrode to be in contact with an n-type GaN-based semiconductor at a TiW alloy layer formed by sputtering using a Ti—W target containing Ti by 10 wt % has extremely superior heat resistance since, in sample A, the surface of the electrode was not roughened by the heat treatment, and the n-n voltage did not change substantially by the heat treatment. It is also understood that this electrode formed by sputtering can be used after a heat treatment under the conditions employed in Experimental Example 3. When a heat treatment is applied, the structure of the electrode is stabilized. Therefore, radical change in the property of the electrode can be prevented when the element is exposed to a high temperature during use.

In contrast, the electrode of sample D that is in contact with n-type contact layer at a TiW alloy layer formed using a target having a Ti content of 90 wt % showed markedly increased n-n voltage and deteriorated surface due to the heat treatment. This tendency was common to the electrode of sample C that is in contact with n-type contact layer at a Ti layer. From the results, it is understood that the heat treatment conditions employed in Experimental Example 3 were too severe for an electrode to be in contact with an n-type GaN-based semiconductor at a TiW alloy layer formed by sputtering using a Ti—W target containing Ti by 90 wt %.

The present invention is not limited by the aforementioned Examples and can be modified in various manners without departing from the gist of the invention. For example, in the GaN-based semiconductor element 100 shown in FIG. 1, the p-side bonding electrode P22 may have the same constitution as the n-side electrode P1, in which case they can be formed by the same step, thus simplifying the production process.

This application is based on patent application Nos. 2005-112610 and 2006-31741 filed in Japan, the contents of which are incorporated in full herein by this reference.

The invention claimed is:

1. A semiconductor element comprising an n-type Gallium nitride based compound semiconductor, and an electrode in ohmic contact with the semiconductor, wherein the electrode has a TiW alloy layer in contact with the semiconductor, the TiW alloy layer has a Ti concentration of 70 wt % or below, and the TiW alloy layer has a TiW composition ratio which is substantially constant in the thickness direction of the layer.

2. The semiconductor element of claim 1, wherein said TiW alloy layer has a Ti concentration of 40 wt % or below.

3. The semiconductor element of claim 2, wherein said TiW alloy layer has a Ti concentration of 8 wt % or below.

4. The semiconductor element of claim 1, wherein said TiW alloy layer has a Ti concentration of 4 wt % or above.

5. The semiconductor element of claim 1, wherein the TiW alloy layer is formed by sputtering using a Ti—W target with a Ti content of 90 wt % or below.

6. The semiconductor element of claim 5, wherein the TiW alloy layer is formed by sputtering using a Ti—W target with a Ti content of 10 wt %.

7. The semiconductor element of claim 1, wherein said electrode comprises an Au layer laminated directly on the TiW alloy layer.

8. The semiconductor element of claim 1, wherein the electrode has a metal layer laminated on the TiW alloy layer and made of a single layer of Au or platinum group element, or a laminate having an Au layer or a platinum group element layer as the top layer.

9. The semiconductor element of claim 1, wherein the electrode has a metal layer laminated on the TiW alloy layer and comprising only a metal having the same melting point as Au or a melting point higher than Au.

10. A method of producing a semiconductor element, which comprises a step of forming a TiW alloy layer as a part of an electrode on the surface of an n-type Gallium nitride based compound semiconductor in order that the TiW alloy layer has a TiW composition ratio which is substantially constant in the thickness direction of the layer, the TiW alloy layer having a Ti concentration of 70 wt % or below.

11. The production method of claim 10, wherein the TiW alloy layer is formed by sputtering using a Ti—W target.

12. The production method of claim 11, wherein the TiW alloy layer has a Ti concentration of 4 wt % or above.

13. The production method of claim 11, wherein the Ti—W target has a Ti content of 90 wt % or below.

14. The production method of claim 11, which further comprises a step of heat-treating the TiW alloy layer.

15. The production method of claim 14, wherein the TiW alloy layer has a Ti concentration of 8 wt % or below.

16. The production method of claim 14, wherein the Ti—W target has a Ti content of 10 wt % or below.

17. The production method of claim 14, wherein the surface of the electrode has an arithmetic mean roughness Ra of 0.02 μm or below after the heat-treating step.

18. The semiconductor element of claim 1, wherein the electrode has a metal layer laminated on the TiW alloy layer.

19. The semiconductor element of claim 1, wherein the surface of the electrode has an arithmetic mean roughness Ra of 0.02 μm or below.

* * * * *